United States Patent
Howell et al.

[11] Patent Number: 6,107,008
[45] Date of Patent: *Aug. 22, 2000

[54] IONIZING RADIATION POST-CURING OF OBJECTS PRODUCED BY STEREOLITHOGRAPHY AND OTHER METHODS

[75] Inventors: David H. Howell; Claude C. Eberle, both of Knoxville; Christopher J. Janke, Oliver Springs, all of Tenn.

[73] Assignees: Lockheed Martin Energy Research; Lockheed Martin Energy Systems, Inc., both of Oak Ridge, Tenn.

[*] Notice: This patent issued on a continued prosecution application filed under 37 CFR 1.53(d), and is subject to the twenty year patent term provisions of 35 U.S.C. 154(a)(2).

[21] Appl. No.: 08/921,417

[22] Filed: Aug. 29, 1997

[51] Int. Cl.$^7$ .............................. G03F 7/26; B29C 71/04
[52] U.S. Cl. .................. 430/328; 430/942; 430/394; 430/966; 430/967; 264/401; 264/486; 264/488; 264/482; 264/485; 522/2; 522/4
[58] Field of Search .................................... 430/328, 296, 430/942, 394, 966, 967, 269; 264/401, 486, 488, 482, 485; 522/2, 4

[56] References Cited

U.S. PATENT DOCUMENTS

| | | | |
|---|---|---|---|
| 3,644,161 | 2/1972 | Hall | 156/272 |
| 4,230,649 | 10/1980 | Bohm et al. | 264/22 |
| 4,362,674 | 12/1982 | DuPont et al. | 264/22 |
| 4,367,185 | 1/1983 | Nojiri et al. | 264/22 |
| 4,575,330 | 3/1986 | Hull | 425/162 |
| 4,593,051 | 6/1986 | Koleske | 522/31 |
| 4,702,995 | 10/1987 | Okada | 430/967 X |
| 4,734,477 | 3/1988 | Inoue et al. | 526/320 |
| 4,945,032 | 7/1990 | Murphy et al. | 430/394 |
| 4,983,335 | 1/1991 | Matsuo et al. | 264/25 |
| 5,260,349 | 11/1993 | Crivello | 522/31 |
| 5,296,335 | 3/1994 | Thomas et al. | 430/320 |
| 5,458,825 | 10/1995 | Grolman et al. | 264/401 |
| 5,506,087 | 4/1996 | Lapin et al. | 264/401 |
| 5,590,454 | 1/1997 | Richardson | 29/527.4 |
| 5,605,941 | 2/1997 | Steinmann et al. | 522/170 |
| 5,726,216 | 3/1998 | Janke et al. | 522/31 |
| 5,877,229 | 3/1999 | Janke et al. | 522/31 |

FOREIGN PATENT DOCUMENTS 0 499 542 A1   8/1992   European Pat. Off. .

OTHER PUBLICATIONS

Radiation Curing in Polymer Science and Technology, vol. 1, Fundamentals and Methods, Chapter 9 Electron–Beam Processing Machinery, Chpt. 9, pp. 503–505, Nablo, London, 1993.

Chemistry & Technology of UB and EB Formulation for Coatings, Inks and Paints, vol. 1, "Markets & Curing Equipment" pp. 75 and 119, Defour et al., SITA Technology Gardiner House, London, 1991.

Journal of Photochemistry and Photobiology A: Chemistry v. 58, p. 123, 1991.

Electron Beam Curing of Bisphenol–A Type Expoxy Resin, 1987, Okada et al.

J.V. Crivello, Advances in Polymer Science, v. 61, p. 1, 1984.

*Primary Examiner*—Cynthia Hamilton
*Attorney, Agent, or Firm*—Hardaway Mann IP Group

[57] ABSTRACT

An object comprised of a curable material and formed by stereolithography or another three-dimensional prototyping method, in which the object has undergone initial curing, is subjected to post-curing by ionizing radiation, such as an electron beam having a predetermined beam output energy, which is applied in a predetermined dosage and at a predetermined dose rate. The post-cured object exhibits a property profile which is superior to that which existed prior to the ionizing radiation post-curing.

1 Claim, 1 Drawing Sheet

IONIZING RADIATION POST-CURING OF OBJECTS PRODUCED BY STEREOLITHOGRAPHY AND OTHER METHODS

STATEMENT AS TO RIGHTS TO INVENTIONS MADE UNDER FEDERALLY-SPONSORED RESEARCH AND DEVELOPMENT

The U.S. Government has certain rights in this invention pursuant to contracts numbers DE-AC05-96OR22464 and DE-AC05-84OR21400, between the United States Department of Energy and Lockheed Martin Energy Services, Inc.

BACKGROUND OF THE INVENTION

1. Field of the Invention

The present invention resides in the field of rapid prototyping technology, in which three-dimensional objects are formed in various ways responsive to user-defined geometric parameters.

2. Description of the Relevant Art

Various processes have been developed to produce three-dimensional objects, also called models and prototypes, in which an object is formed by a computer-controlled machine in accordance with dimensional parameters defined by the user. Several of these methods, including stereolithography, are described in the background section of U.S. Pat. No. 5,590,454 to Richardson.

In processes such as stereolithography, a liquid polymer is selectively solidified and cured, by means such as a laser, in successive layers until a final object is formed. Once the object has been formed, it is rinsed and then undergoes post-curing, since a laser is not capable of completely curing the material. For instance, U.S. Pat. No. 4,575,330 to Hull teaches use of an ultraviolet ("UV") floodlight to post-cure the formed object. Such post-curing is subject to certain drawbacks. It has been found that UV light cannot fully cure certain resins, such as, for example, epoxy resins cured with a cationic initiator. Consequently, post-curing of the object is necessary to fully cure the material. If such post-curing is done thermally, i.e., by placing the object in a high-temperature setting (such as an oven or autoclave), toxic fumes are produced, which are harmful to the process operator and to the environment generally. Given such drawbacks, an improved means of post-curing is desirable.

The aforementioned patent to Hull suggests possible substitution of an electron source for the UV light source described with regard to the preferred embodiment. In the example of such use, Hull teaches the application of an electron beam to material which has been prepolymerized with UV light. However, there is no disclosure regarding application of an electron beam in a post-curing step. Furthermore, Hull does not mention what dosage rates and energy magnitude would be appropriate to cure material using an electron beam. It has been found that if a low-energy electron beam is used, the material is only partially cured during the object-forming phase, so post-curing of the object would still be necessary. If, on the other hand, a high-energy electron beam is used, the beam would penetrate the liquid polymer to a significant degree, such that a cured discrete layer is considerably thicker than the layers successively obtained with a laser or low-energy electron beam. Such a result diminishes the dimensional precision inherent with the standard or low-energy electron beam stereolithographic process. Finally, a stereolithographic machine employing an electron beam source is not commercially available. Therefore, there is a need in the three-dimensional prototyping field to derive the benefits of electron beam curing with a method which overcomes the foregoing disadvantages.

SUMMARY OF THE INVENTION

It is an important aspect of the present invention to provide an object production method which overcomes the foregoing limitations associated with prior art methods.

It is a further aspect of the present invention to provide an object production method which results in an object having a property profile superior to that of objects produced by prior art methods.

It is a further aspect of the present invention to provide an object production method in which energy is volumetrically deposited into the object during post-curing.

It is a still further aspect of the present invention to provide an object production method which significantly reduces toxic byproducts attendant with prior art methods.

It is yet a still further aspect of the present invention to provide an object-production method which does not require modification of commercially available equipment.

These as well as other aspects are accomplished by a method of producing an object, comprising the steps of forming the object from a curable material, partially curing the curable material, and post-curing said curable material with ionizing radiation, such as an electron beam having a predetermined beam output energy, which emitted from a source in a predetermined dosage at a predetermined dose rate. Such aspects are also accomplished by a method of using ionizing radiation to post-cure a partially-cured object formed from a curable material, comprising the steps of placing the object in proximity to a source of ionizing radiation, and causing the source to emit ionizing radiation. The object after ionizing radiation post-curing thereby exhibits a better property profile than that which existed prior to ionizing radiation post-curing.

BRIEF DESCRIPTION OF THE DRAWING

The invention will be more readily understood from a reading of the following specification and by reference to the accompanying drawing forming a part thereof, wherein an example of the invention is shown and wherein.

DESCRIPTION OF THE PREFERRED METHOD

Figure 1:
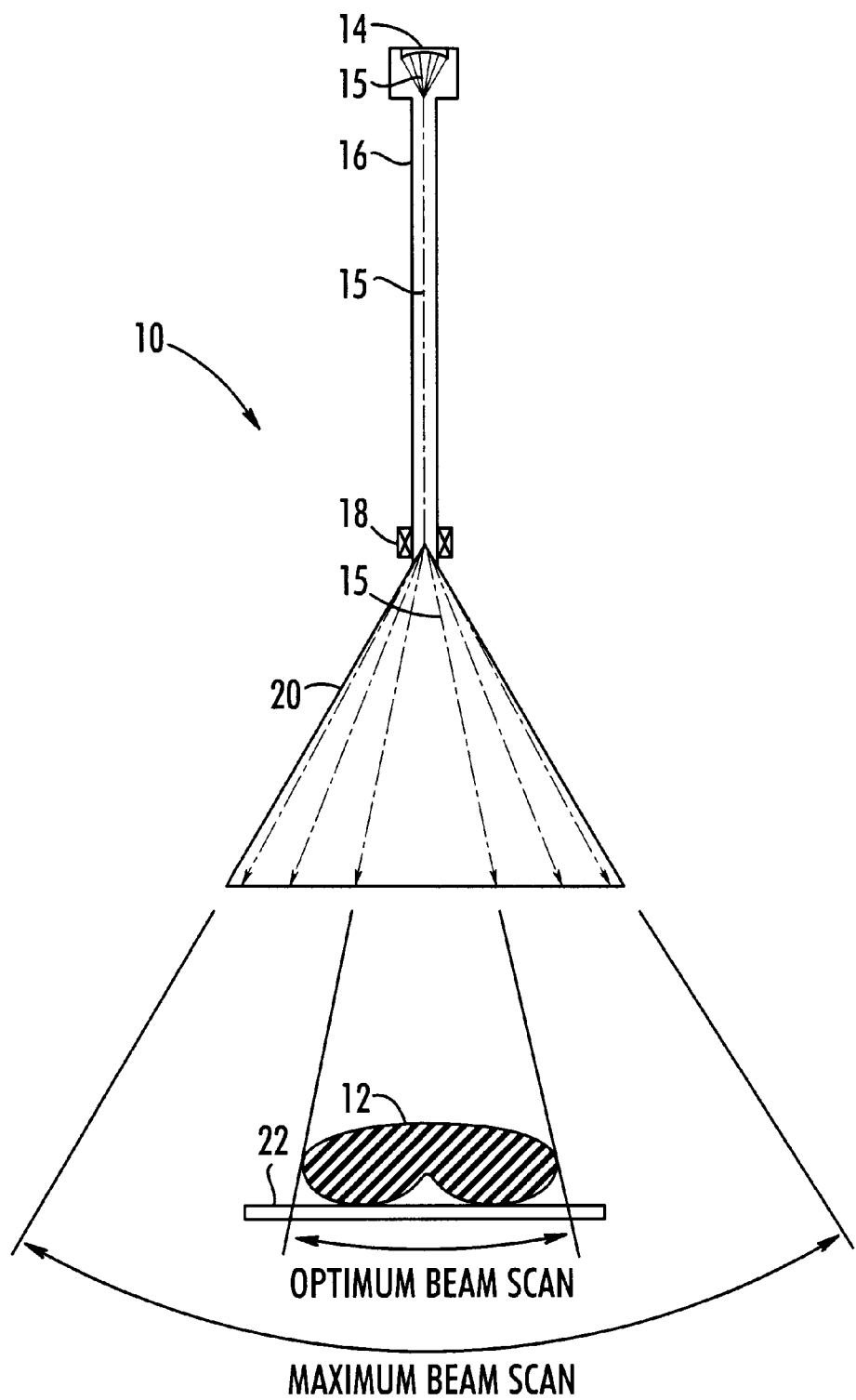
FIG. 1 is a front view of an electron beam source effecting post-curing of an object, in accordance with the preferred method of the present invention.

An object 12 (see FIG. 1) comprised of curable material may be formed by a variety of three-dimensional prototyping methods, such as stereolithography. As used herein, the term "curable material" includes any material which is curable (i.e., which can by polymerized and/or cross-linked) by UV light, a laser, ionizing radiation (including but not limited to an electron beam, gamma rays or x-rays), or a combination of any of the foregoing. The term "curable material" shall also be construed to mean a composite material comprising a mixture of both curable and non-curable materials, such as a resin in which fibers and/or fillers are intermixed. Preferred curable materials comprise epoxy resins of the type disclosed in co-pending application Ser. No. 08/507,569, U.S. Pat. No. 5,877,229 filed Jul. 26, 1995, and in co-pending application Ser. No. 08/676,768, filed Jul. 8, 1996, now U.S. Pat. No. 5,726,216 the disclosures of both applications being hereby incorporated herein by reference. For instance, such a preferred curable material may comprise a semi-solid triglycidyl ether of tris (hydroxyphenyl) methane and a low viscosity bisphenol A epoxy resin.

Machines for performing stereolithography are known and are commercially available from, for instance, 3D Systems, Inc. of Valencia, Calif. As such, the particular steps for initially forming the object are not considered a part of this invention and are therefore not described in detail.

During its formation in the stereolithographic process, the object 12 undergoes initial, partial curing, normally by application of UV light or a laser. The object 12 is then transported to a location proximate an electron beam source, the term "proximate" meaning at a close distance to the source sufficient to enable the source to effect post-curing of the material comprising the object. Electron beam sources are commercially available from Atomic Energy Canada, Ltd. of Kanata, Ontario, Canada, sold under the name IMPELA, and also from Ion Beam Applications, Inc. of Brussels, Belgium, sold under the name RHODOTRON.

FIG. 1 illustrates an electron beam source 10 effecting post-curing of the object 12. Source 10 includes an electron gun 14, comprising a heated filament from which electrons are emitted. The electrons are electromagnetically guided and accelerated, forming an electron beam 15, through an accelerating section 16 until they achieve the desired energy level. Bending magnets 18 placed at the output of accelerating section 16 apply a magnetic field to the beam 15 to effect bending thereof. By varying the magnetic field in a controlled manner, the bending angle can be changed to produce a beam "sweeping" or scanning effect through a specified angle. After the beam 15 is bent, it enters a scan horn 20, which is an evacuated structure that allows the beam 15 to remain in vacuum until it is physically near the target, here, object 12. The beam exits the scan horn 20 through a thin metal window and travels a short distance in air before finally striking and depositing energy in the object 12.

The beam 15 is repeatedly and rapidly swept back and forth, drawing an imaginary line where the electrons strike object 12. Raster scanning can be effected by moving object 12 perpendicular to the beam scanning direction (into the page of FIG. 1), such as by way of a conveyor 22, thereby achieving full two-dimensional coverage of the target surface area.

The beam 15 emitted by electron beam source 10 has a predetermined beam output energy preferably ranging from about 200 keV to about 15 MeV, with 10 MeV being a more common upper limit for the beam output energy. To assure complete curing, beam 15 is applied at a predetermined dosage, preferably from about 20 kGy to about 500 kGy, and this dosage is applied at a predetermined dose rate, on the order of about 0.75 kGy/sec to about 2.0 MGy/sec. The specific electron beam dosage employed for a given object varies with certain parameters regarding that object, such as the resin composition and the presence of fibers and/or fillers, such as of the type described in the aforementioned co-pending patent applications incorporated herein by reference. Advantageously, the electrons transfer their kinetic energy by atomic and molecular interactions as they travel through the object 12. This provides the energy that is needed to effect chemical changes, including reactions and cross-linking. Thus, the electron beam 15 deposits energy volumetrically into the object 12, meaning that energy penetrates completely through the object 12 instantaneously to effect rapid post-curing, in contrast to the surface deposition of energy resulting from laser curing that occurs with stereolithography.

It has been found that an object which has been post-cured according to the present invention exhibits a property profile which is superior to that which existed prior to the ionizing radiation post-curing. The term "property profile", as used herein, includes glass transition temperature, mechanical properties (such as compressive strength), chemical resistance, and moisture resistance. Regarding glass transition temperature (defined as the temperature at which a polymer changes from a glassy state to a rubbery state), objects produced by the process of the present invention have glass transition temperatures ranging from 100° C. to 400° C., thus indicating usefulness at high surface temperatures. Additionally, if the object is constructed from a resin of the preferred type described above, the object also possesses reduced brittleness and/or an even better property profile, as compared to objects produced from conventional light-curable or UV-curable resins.

The process of the present invention demonstrates additional advantages. First, ionizing radiation post-curing significantly reduces the amount of toxic fumes which would otherwise appear in a thermal post-curing process. Finally, ionizing radiation post-cures an object in much less time than that required for conventional post-curing. Specifically, post-curing according to the process of the present invention is significantly faster than thermal post-curing.

Although the post-curing process of the present invention has been described herein with reference to an object produced by stereolithography, it is not necessarily limited to that context. The process of the present invention may also be directed to objects constructed of curable material and produced by other three-dimensional prototyping methods, including but not limited to solid ground curing.

As the foregoing description is merely exemplary in nature, being merely illustrative of the invention, many variations will become apparent to those of skill in the art. Such variations are included within the spirit and scope of this invention as defined by the following appended claims.

What is claimed is:

1. A method for forming an object comprising:
  forming a mixture of a cationically curable epoxy resin and a cationic initiator;
  shaping said mixture by irradiating the mixture in a pattern using actinic radiation sufficient to obtain an uniform and incomplete cure; and
  post-curing said shaped mixture without thermal cure by irradiation using high-energy electron beam ionizing radiation for a period of time sufficient to effectuate efficient cross-linking and an essentially complete and uniform curing, wherein said curable epoxy resin comprises a semi-solid triglycidyl ether of tris (hydroxyphenyl) methane and a low viscosity bisphenol A epoxy resin.

* * * * *